United States Patent
Yang et al.

(10) Patent No.: US 9,614,486 B1
(45) Date of Patent: Apr. 4, 2017

(54) ADAPTIVE GAIN CONTROL

(71) Applicant: Amazon Technologies, Inc., Seattle, WA (US)

(72) Inventors: Jun Yang, San Jose, CA (US); Philip Ryan Hilmes, San Jose, CA (US); Colin McEnroe, San Mateo, CA (US); Chad G Seguin, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/984,770

(22) Filed: Dec. 30, 2015

(51) Int. Cl.
*H03G 3/00* (2006.01)
*H03G 3/30* (2006.01)

(52) U.S. Cl.
CPC .................. *H03G 3/3005* (2013.01)

(58) Field of Classification Search
CPC .............................. H03G 3/3005; H03G 11/00
USPC .......................................... 381/94.8
See application file for complete search history.

(56) References Cited

U.S. PATENT DOCUMENTS

| | | | | |
|---|---|---|---|---|
| 5,267,322 A | * | 11/1993 | Smith .................. | H03G 3/3026 375/345 |
| 8,315,410 B2 | * | 11/2012 | Magrath ................ | H03G 7/007 330/279 |
| 2007/0273446 A1 | * | 11/2007 | Kim ...................... | H03F 3/2171 330/284 |

* cited by examiner

*Primary Examiner* — Brenda Bernardi
(74) *Attorney, Agent, or Firm* — Lee & Hayes, PLLC

(57) ABSTRACT

A gain control system is responsive to a user gain setting and to an effective signal level to calculate and adaptively vary an output gain to avoid output clipping. The effective signal level is calculated by smoothing the energy of an input audio signal in accordance with selected attenuation factors. In times during which fast transient sounds are occurring, attenuation factors corresponding to relatively low levels of attenuation are selected. In times during which fast transient sounds are not detected, attenuation factors corresponding to relatively higher levels of attenuation are selected. The effective signal level is held at a constant level during periods of silence in order to avoid increasing the output gain during these periods. The output gain is calculated based on a comparison of the effective signal level to a compression threshold.

20 Claims, 6 Drawing Sheets

ADAPTIVE GAIN CONTROL

BACKGROUND

The audio volume produced by an audio device is typically controlled by a user gain setting. When listening to some types of content, the user may adjust the gain setting to a relatively high value, which may be appropriate for that type of content. When playing other content, however, the gain setting may result in output distortion such as saturation or clipping. While output distortion may reduce the quality of the user's listening experience, such distortion may also degrade other audio device functionality such as echo cancellation.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Described herein are techniques for adaptively controlling an audio output gain in order to keep an output signal below a level that might otherwise produce audible clipping. In described embodiments, the output gain applied to an input audio signal is varied based on a changing energy magnitude of the input audio signal. In addition, variations in the output gain are tracked and smoothed by a variable degree in accordance with the type of sound currently represented by the input audio signal. If the input audio signal represents fast transient sounds, for example, a lower degree of smoothing is applied to allow faster adaptation of the output gain. If sounds of longer duration are present in the input audio signal, a higher degree of smoothing may be applied to limit or decrease the rate of output gain changes.

In a described embodiment, the energy of the input audio signal is smoothed over time to create a smoothed energy level, also referred to herein as an effective signal level, and the output gain is calculated based on the effective signal level. The smoothing may be performed by attenuating the energy magnitude of the input audio signal. The rate or degree of attenuation is determined by analyzing a portion of the input audio signal to determine the duration of an energy pulse that is identified within the input audio signal. If the duration is less than a threshold, a low degree of attenuation is used for a faster response time. If the duration is greater than the threshold, a higher degree of attenuation is used for a slower response time.

The degree of attenuation may also be varied based on whether the input audio signal currently represents audio activity or whether it currently represents relative silence. Greater attenuation is used during periods of silence in order to prevent increases in output gain during these times.

Figure 1:
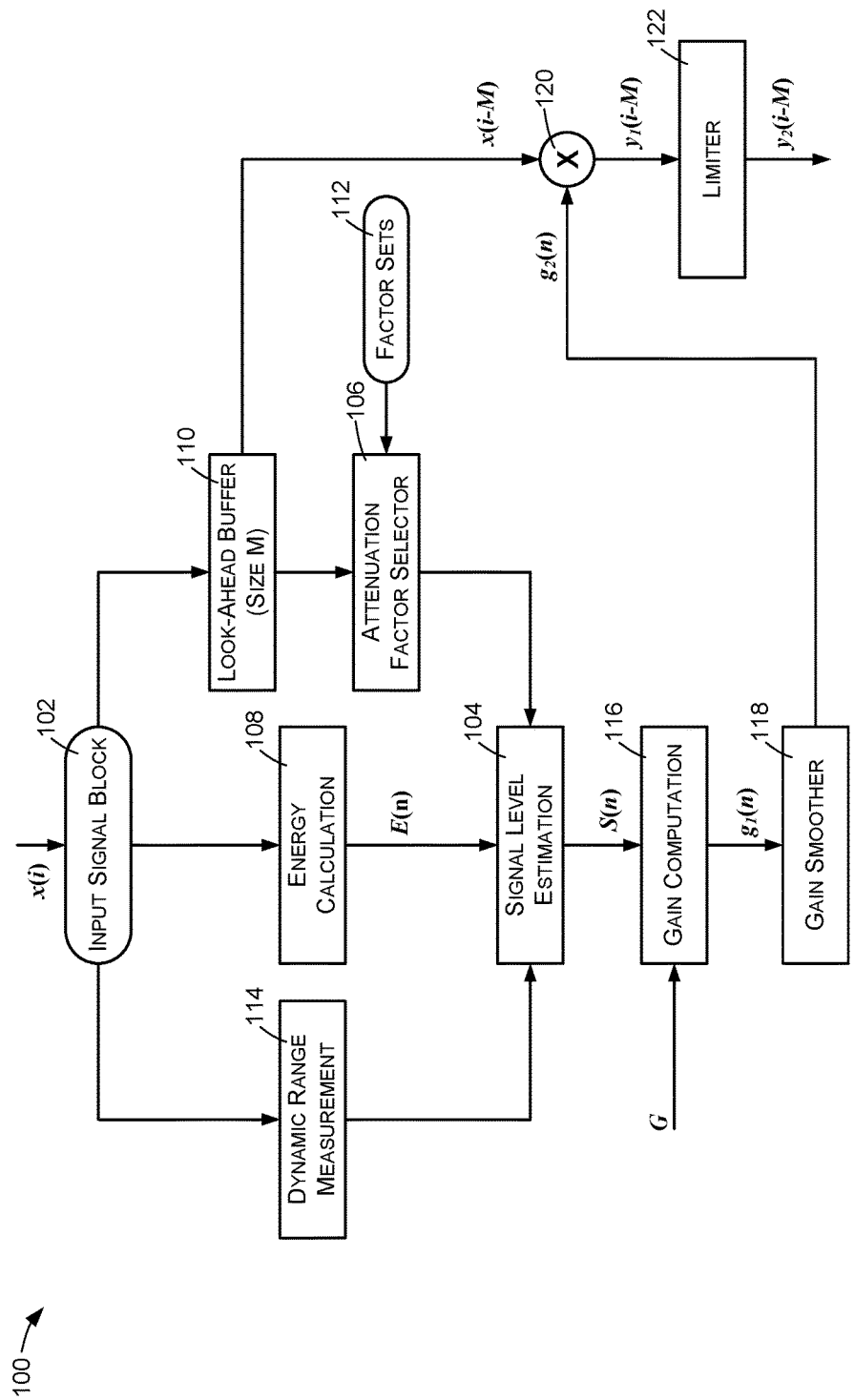
FIG. 1 is a block diagram illustrating logical components of a system for implementing adaptive gain control.

FIG. 1 shows relevant logical components of a signal processing device or system 100 for processing an input audio signal x in order to produce an output audio signal y that is controlled by a user gain setting G. The input audio signal x is received from an audio source (not shown). In the examples described herein, the audio signal x comprises a continuous ordered sequence of digital amplitude values, also referred to herein as input values. The nomenclature "x(i)" indicates the $i^{th}$ value of a sequence of the digital amplitude values. The input value x(i−1) is the input value that immediately precedes the input value x(i) in the sequence. The input value x(i+1) is the input value that immediately follows the input value x(i) in the sequence. Similar nomenclature is used for other signals. For example, the output audio signal y has a value y(i), corresponding to value x(i) of the input audio signal.

The input values may be received in sequential blocks 102, where each block 102 contains a number N (N=128 or N=256, as examples) of the amplitude values. Such blocks are sometimes referred to as frames, and may also be referred to herein as input value sets or sets of input values. In the following discussion, the symbol "n" is used as a frame index. Thus, a frame n is followed by a frame n+1.

The components of FIG. 1 are designed to operate with respect to each received input value x(i) of the input signal x and to produce a corresponding output value y(i) of the output audio signal y. The components are further designed to produce an output gain g(n) corresponding to each frame n. The output gain g(n) is applied to the input values of the frame n to produce the output values.

The output gain is dependent on and controlled in part by a user gain setting G. The user gain setting G is controlled in turn by a user interface element such as a physical knob, a graphical user interface, an audio user interface, etc. For example, a user may set the user gain setting G by manipulating a displayed control or by speaking a command to a speech-enabled device.

The user gain setting G may correspond to a numerical value. For example, the user gain setting 104 may vary in value from 0 to 10 or from 0% to 100%. In practice, the user gain setting 104 may correspond to or be converted to a decibel (dB) value relative to 0 dBFS of the system 100.

The system 100 comprises a signal level estimation component 104 that produces an effective signal level S(n) based on the output of an attenuation factor selector 106 and on a calculated energy E(n) of a corresponding frame n of the input audio signal x as calculated by an energy calculation component 108. The energy E(n) may be calculated as an average of multiple input values of the input signal block 102.

The attenuation factor selector 106 works in conjunction with a look-ahead buffer 110 that contains the most recent input values x(i) through x(i−M+1) of the input audio signal x, where M is the size of the look-ahead buffer 110. The buffered input values x(i−1) through x(i−M+1) temporally precede the input value x(i). In an example implementation, M is equal to 1680, which corresponds to about 35 milliseconds of audio at a 48 kilohertz sampling rate. Thus, the buffer 110 is significantly larger than the input audio signal block 102, and may contain the input values of several input audio signal blocks 102.

The look-ahead buffer 110 may comprise a circular buffer that receives the input value x(i) and buffers previous input values of the audio signal x. A circular buffer such as this has a head into which values enter the buffer, and a tail from which values are provided from the buffer. When providing a value from the tail of the buffer, the earliest-received value is provided rather than the most recently buffered value x(i). Specifically, the input value x(i−M+1) is obtained from the tail of the buffer.

The attenuation factor selector 106 selects from predefined sets 112 of attenuation factors based on characteristics of the audio represented by the input values stored in the look-ahead buffer 110. For example, the attenuation factor selector 106 may be configured to identify an energy pulse in the input audio signal x and to determine a duration of the energy pulse. Generally, a waveform pulse is a change in amplitude of a waveform to a higher or lower value, followed by a subsequent change back to the original amplitude or near the original amplitude.

When the buffer 110 contains a transient energy pulse of a relatively short duration, an attenuation factor set 112 having attenuation factors that produce relatively fast response times is selected. When the buffer 110 contains sustained sound of a relatively longer duration, an attenuation factor set 112 having attenuation factors that produce relatively slow response times is selected.

As will be described herein, each attenuation factor set 112 may comprise multiple attenuation factors. "Fast" attenuation factors are values closer to 1.0, while "slow" attenuation factors are values that are smaller fractions of 1.0. Each attenuation factor of a set of "fast" attenuation factors may be greater than the corresponding attenuation factor of a set of "slow" attenuation factors. A set of "slow" attenuation factors may be used to provide high attenuation or dampening rates.

The signal level estimation component 104 produces the effective signal level S(n) by smoothing the energy E(n) over time in accordance with the attenuation factors of the selected attenuation factor set 112. The effective signal level estimation component 104 acts as a low-pass filter whose response time is governed by the attenuation factors of the selected attenuation factor set 112. Relatively large attenuation factors result in relatively faster response times, and are used when short-duration transient sounds are occurring. Relatively small attenuation factors result in relatively slower response times, and are used when sustained sound or longer duration transient sounds are occurring.

During times in which the input audio signal x represents a low sound level, which is deemed to represent relative silence, the signal level estimation component 104 keeps the effective signal level S(n) at a constant value, despite changes in the energy E(n). A dynamic range measurement component 114 evaluates the dynamic range of the input audio signal x to determine whether the input audio signal x represents silence. A low dynamic range indicates relative silence. A high dynamic range indicates the presence of sound above a threshold level. In certain embodiments, dynamic range comprises a ratio of the highest and lowest sound levels that are currently present in the input audio signal.

The effective signal level S(n) is received by a gain computation component 116, which calculates a preliminary gain $g_1(n)$ based on the effective signal level S(n) and the user gain setting 104. At low values of the user gain setting 104, such as below 0 dBFS, the preliminary gain $g_1(n)$ is set equal to the user gain setting. At higher user gain settings, however, such as above 0 dBFS, the gain computation component 116 limits the preliminary gain $g_1(n)$ based on the effective signal level S(n) to ensure that the amplitude of the output audio signal y does not cause audio clipping.

In some embodiments, a gain smoothing component 118 may be applied to the preliminary gain $g_1(n)$ to create a smoothed output gain $g_2(n)$. Note that "output gain g(n)" as used herein may refer to either the preliminary gain $g_1(n)$ or to the smoothed output gain $g_2(n)$.

An amplification component 120 multiplies or otherwise amplifies the input value x(i−M) by the smoothed output gain $g_2(n)$ to produce the output value $y_1$(i−M). A limiter 122 may be applied to the output signal $y_1$(i−M) to produce a final output signal $y_2$(i−M). Note that references to the "output audio signal y" as used herein may refer to an output signal $y_1$ corresponding to output values $y_1$(i−M) or to an output signal $y_2$ corresponding to output values $y_2$(i−M). The output audio signal y comprises an ordered sequence of individual output values corresponding respectively to the input values of the input audio signal.

Figure 2:
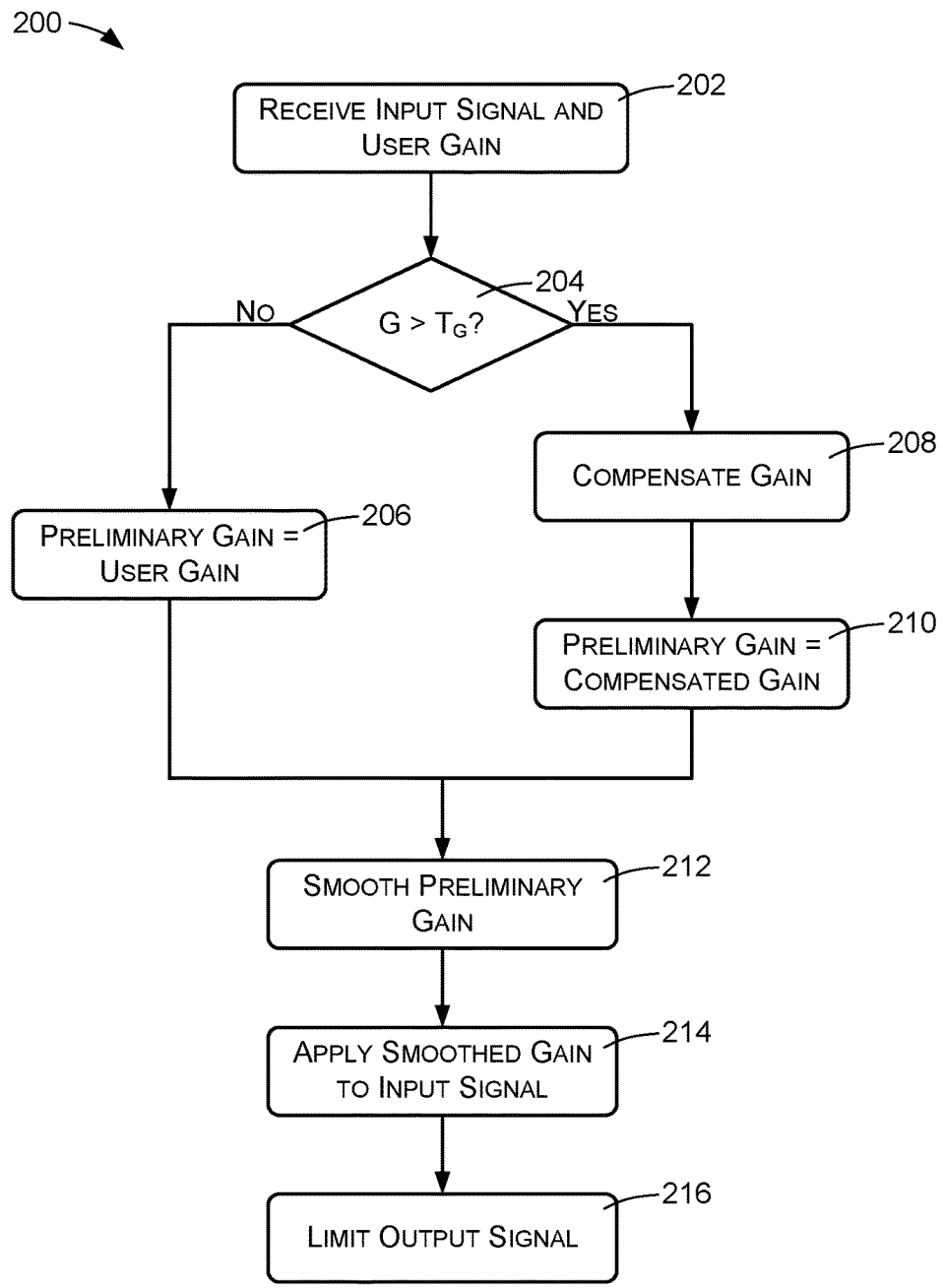
FIG. 2 is a flow diagram illustrating a general method for adaptively controlling an output gain.

FIG. 2 shows an example method 200 that illustrates further details regarding the operation of the system 100 of FIG. 1. Note that FIG. 2 and subsequent flow diagrams illustrate actions performed with respect to an input value x(i) to produce a corresponding output value y(i−M). The depicted actions calculate a gain g(n) for each frame n of input values.

An action 202 comprises receiving an input value x(i) of an input audio signal x, and receiving the user gain setting G. An action 204 comprises determining whether the user gain setting G is greater than a gain threshold $T_G$. If the user gain setting G is not greater than the gain threshold $T_G$, an action 206 is performed of setting the preliminary output gain $g_1(n)$ equal to the user gain setting G. As an example, the gain threshold $T_G$ may be the gain above which audio output clipping becomes a possibility, such as above 0 dBFS. Below this value, it may be unnecessary to perform gain compensation.

If the user gain setting G is greater than the gain threshold $T_G$, an action 208 is performed of adaptively compensating the gain of the system to prevent output clipping. An example of such compensating will be described with reference to subsequent figures. An action 210 comprises setting the preliminary output gain $g_1(n)$ to the compensated gain determined in the action 208.

Subsequent to the action 206 or the action 210, an action 212 may be performed of smoothing the preliminary output gain $g_1(n)$ to produce the smoothed output gain $g_2(n)$. The smoothing can be performed in accordance with the following equation:

$$g_2(n) = g_2(n-1) + c(g_1(n) - g_2(n-1))$$

where c is a smoothing factor between 0 and 1, such as 0.001.

An action 214 may comprise applying the smoothed output gain $g_2(n)$ to the input value x(i−M) to generate the output value $y_1$(i−M). In some cases, a further action 216 of limiting the output signal may also be performed to prevent clipping and avoid clipping related artifacts in rendered audio.

Figure 3:
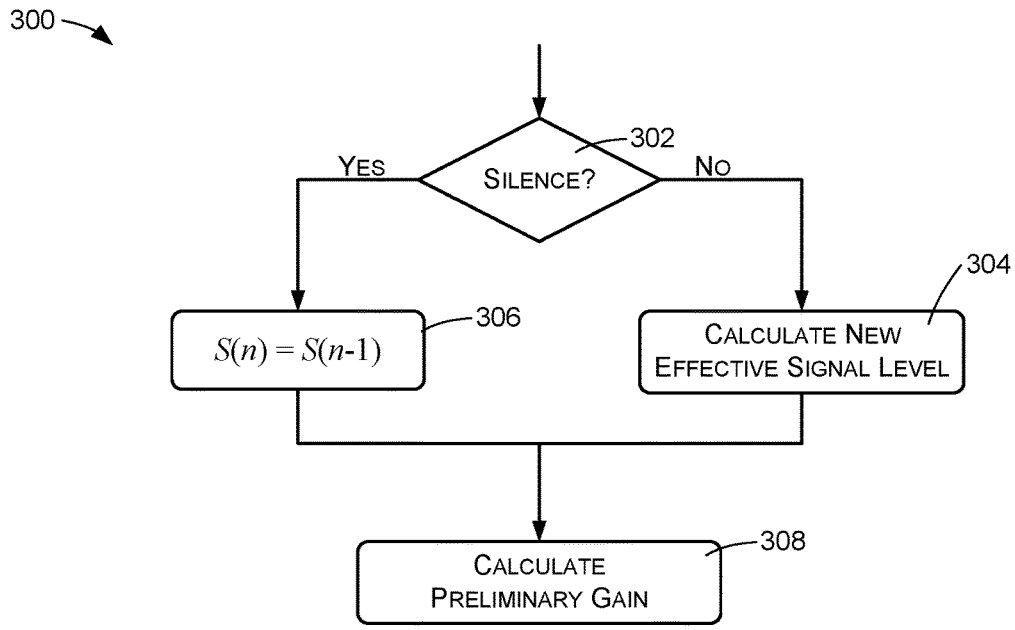
FIG. 3 is a flow diagram illustrating an example method for calculating a preliminary gain.

FIG. 3 illustrates an example method 300 of performing adaptive gain compensation, which may be used for the action 208 of FIG. 2. Generally, the method 300 comprises calculating an effective signal level S(n) corresponding to the frame n containing the input value x(i) and calculating the preliminary gain $g_1(n)$ based on the effective signal level S(n).

An action 302 comprises determining whether the input audio signal x currently represents silence and/or noise. The action 302 may be performed by the dynamic range measurement component 114 of FIG. 1 by evaluating the dynamic range of the input audio signal x.

The dynamic range measurement component 114 calculates the dynamic range of the input audio signal x by (a) estimating an envelope value of the audio signal x, (b) estimating a floor level of the audio signal x, and (c) comparing the envelope and the floor levels. The comparison may comprise calculating the ratio of the envelope value to the floor value, and then comparing the ratio to a dynamic range threshold, which may have an example value of 0.5. If the ratio is less than the dynamic range threshold, the input audio signal x is deemed to represent noise or silence. If the ratio is greater than the dynamic range threshold, the input audio signal x is deemed to represent non-noise audio activity, and not to represent silence.

More specifically, the dynamic range measurement component 114 analyzes a set of input values, which may comprise the input values of the input signal block or frame 102, to determine the dynamic range of the input signal. The envelope value of the input audio signal x may be obtained by identifying the smoothed amplitude boundary within which an energy signal corresponding to the input audio signal x is contained. This may be accomplished using a fast attack and slow release filter, or with a lowpass filter having relatively fast tracking as follows:

$$env(i)=env(i-1)+\alpha(E(i)-env(i-1))$$

where env(n) is the smoothed envelope value, E(i) is the instantaneous energy of the input audio signal corresponding to the input value x(i), and α is a smoothing factor that is a fraction of 1.0, such as 0.01.

The floor value of the audio signal may be obtained by identifying the smoothed average amplitude of an energy signal corresponding to the input audio signal. This may be accomplished using a slow attack and fast release filter, or with lowpass filter having relatively slow tracking as follows:

$$flr(i)=flr(i-1)+\beta(E(i)-flr(i-1))$$

where flr(i) is the floor value and β is a smoothing factor that is a fraction of 1.0, such as 0.00041. E(i) is the instantaneous energy of the input audio signal corresponding to the input value x(i).

If the action 302 determines that the input audio signal x does not represent noise or silence, and/or that the input audio signal x represents non-noise audio activity, an action 304 is performed of estimating the effective signal level S(n) based at least in part on the energy of the input audio signal x. An example technique for estimating the effective signal level S(n) is described below with reference to FIG. 4.

If the action 302 determines that the input audio signal x represents noise or silence, an action 306 is performed of setting the effective signal level S(n) to its previously calculated value S(n−1). That is, S(n)=S(n−1).

An action 308 comprises calculating the preliminary gain $g_1(n)$ based on the user gain setting G and the effective signal level S(n). The action 308 will be described in more detail below with reference to FIG. 9.

Figure 4:
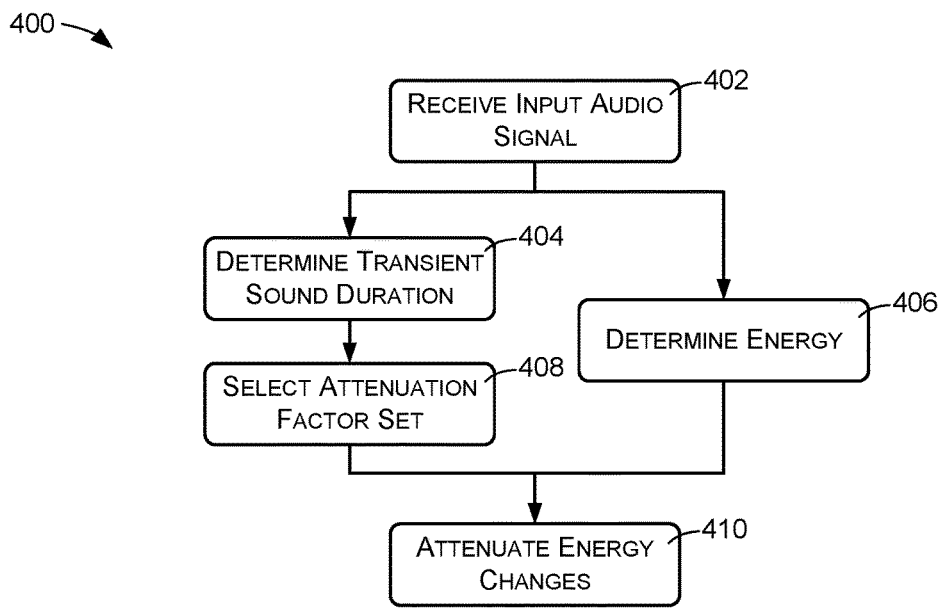
FIG. 4 is a flow diagram illustrating an example method for calculating an effective signal level.

FIG. 4 illustrates an example method 400, which may be used to perform the action 304 of FIG. 3 to calculate the effective signal level S(n). An action 402 comprises receiving the input audio signal x. An action 404 comprises determining a duration of an energy pulse of the first input audio signal x, representing a recently occurring transient sound. The energy pulse duration may be calculated as described below with reference to FIGS. 5 and 6.

An action 406 comprises determining a current magnitude of the input audio signal. In some embodiments, this may comprise determining the frame energy E(n) of the input audio signal. The frame energy E(n) is calculated by summing the absolute values of the input audio block 102, averaging the absolute values of the input values, and/or averaging the squared input values of the input audio signal.

More specifically, the frame energy E(n) for a frame n may be calculated as an average of the absolute values of the values of the block 102. For example, the frame energy E(n) may be calculated based on the block 102 that contains the input value x(i) as follows:

$$E(n) = \frac{1}{N}\sum_{i=0}^{N-1} |x(i)|$$

where N is the number of values contained in the block 102 and x(i) is the $i^{th}$ value in the block 102. Alternatively, the energy E(n) may be calculated as an average of the squared values of the block 102 as follows:

$$E(n) = \frac{1}{N}\sum_{i=0}^{N-1} (x(i))^2$$

An action 408 comprises selecting an attenuation factor set. The action 408 may be based on the pulse width determination of the action 404. Generally, attenuation factors producing relatively fast response times are selected for signals having shorter pulse durations. In the described embodiments, relatively greater valued attenuation factors, such as attenuation factors approaching the value 1.0, produce faster response times.

An action 410 comprises attenuating changes in the frame energy E(n) in order to produce an effective signal level S(n) corresponding to the frame n. As an example, the effective signal S(n) may be calculated as follows:

$$S(n)=S(n-1)+k*(E(n)-S(n-1));$$

where S(n−1) is a previous effective signal level corresponding to the frame n−1, k is a selected attenuation factor, and E(n) is the frame energy corresponding to the frame n. The degree of attenuation is controlled by the attenuation factor k and depends at least in part on the duration of the transient sound as determined in the action 404. Furthermore, in some embodiments positive changes in the magnitude of the input signal may be attenuated by a first degree (i.e., attack stage) and negative changes in the magnitude of the input signal may be attenuated by a second degree (i.e., release stage), wherein the second degree is less than the first degree (i.e., fast attack and slow release). Selection of appropriate attenuation factors may be performed in accordance with the methods 700 and 800 of FIGS. 7 and 8.

Figure 5:
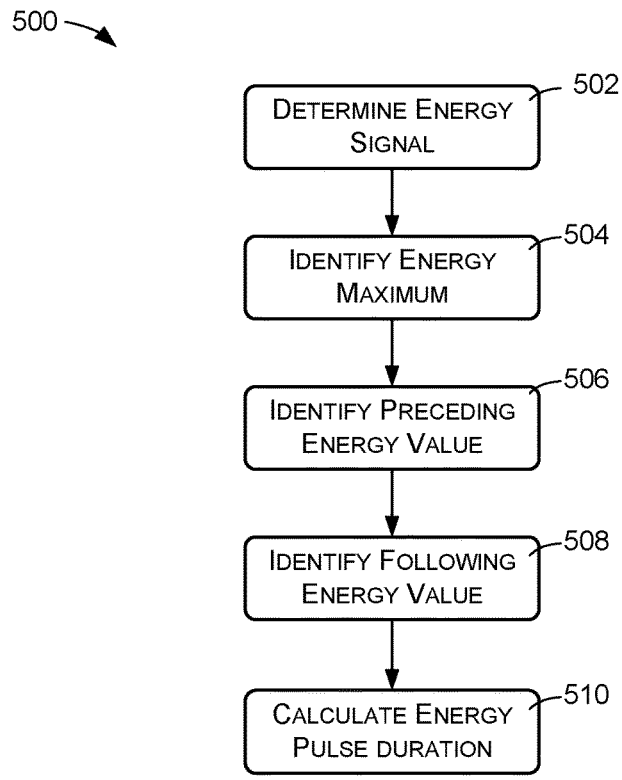
FIG. 5 is a flow diagram illustrating an example method of determining a duration of a recent transient sound.
Figure 6:
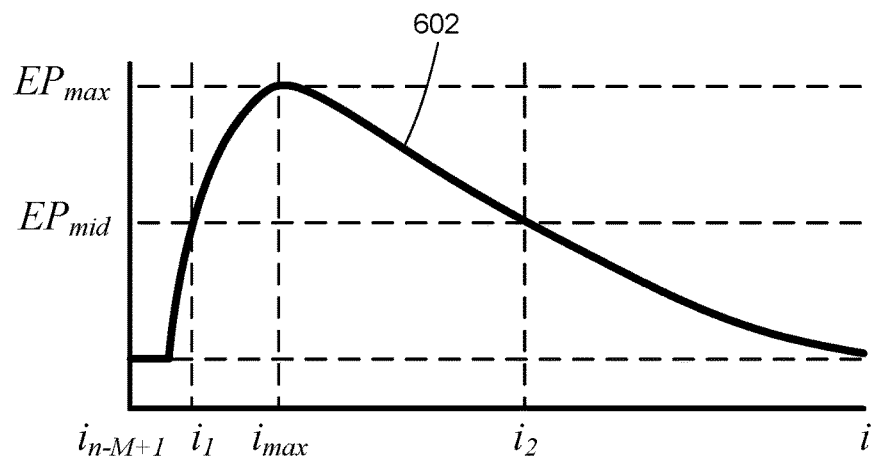
FIG. 6 is a waveform diagram illustrating aspects of calculating a width of an energy pulse representing a recent transient sound.

FIGS. 5 and 6 illustrate an example method 500 of determining the duration, also referred to as a width, of a recent transient sound event represented by the input audio signal x. Generally, the method 500 comprises analyzing a set of input values comprising the recently occurring values x(i−M+1) through x(i), stored in the look-ahead buffer 110, to determine a duration of an energy pulse of the input signal x. Thus, the method 500 is based at least in part on input values that precede the input value x(i). FIG. 6 illustrates an energy pulse signal 602 corresponding to the input values x(i−M+1) through x(n) and indicating the instantaneous energy E(i) of the input audio signal x.

An action 502 comprises analyzing the input values x(i−M+1) through x(i), to determine an energy pulse signal 602 corresponding to the input audio signal x. The energy pulse signal 602 comprises an ordered sequence of energy pulse values EP(i−M+1) through EP(i), corresponding respectively to the ordered sequence of input values x(i−M+1) through x(i). The horizontal axis of FIG. 6 corresponds to the time index i of the input audio signal x. The vertical axis corresponds to the amplitude or magnitude of the energy pulse signal 602. The instantaneous energy values of the energy pulse signal 602 may be calculated in accordance with the following recursive equations:

$$EP(i-2)=EP(i-3)+\gamma(|x(i-2)|-EP(i-3))$$

$$EP(i-1)=EP(i-2)+\gamma(|x(i-1)|-EP(i-2))$$

$$EP(i)=EP(i-1)+\gamma(|x(i)|-EP(i-1))$$

where $\gamma$ is a smoothing factor that is a fraction of 1.0, such as 0.002.

An action 504 comprises identifying a maximum energy value $EP(_{max})$ of the energy pulse signal 602. The action 504 may comprise referencing each of the energy values EP(i−M+1) through EP(i)) to determine which is the greatest.

An action 506 comprises determining a preceding energy value $EP(i_1)$ that is (a) before the maximum energy value $EP(i_{max})$ in the energy pulse signal 602 and (b) less than the maximum energy value $EP(i_{max})$ by at least a threshold amount. The action 506 may comprise searching backward through the energy values EP from $EP(i_{max})$ to find the energy value EP nearest to $EP(i_{max})$ that is less than or equal to a threshold energy value $E_{mid}$.

An action 508 comprises determining a following energy value $EP(i_2)$ that is (a) after the maximum energy value $EP(i_{max})$ in the energy pulse signal 602 and (b) less than the maximum energy value $E(i_{max})$ by at least a threshold amount. The action 506 may comprise searching forward through the energy values EP from $E(i_{max})$ to find the energy value EP nearest to $E(i_{max})$ that is less than or equal to the threshold energy value $E_{mid}$.

As an example, the threshold energy value $E_{mid}$ may be a fraction of the maximum energy value $E(i_{max})$, such as 50% of the maximum energy value $E(i_{max})$.

An action 510 comprises calculating the width or duration of the energy pulse represented by the energy pulse signal 602 based on $EP(i_1)$ and $EP(i_2)$. Specifically, the width W may be calculated as $W=i_2-i_1$.

In the case where the preceding energy value $EP(i_1)$ is not found, W may be calculated as $W=2(i_2-i_{max})$. In the case where the following energy value $EP(i_2)$ is not found, W may be calculated as $W=2(i_{max}-i_1)$. If neither the preceding energy value $EP(i_1)$ nor the following energy value $EP(i_2)$ are found, W is considered to be equal to or greater than the width M of the look-ahead buffer 110.

Figure 7:
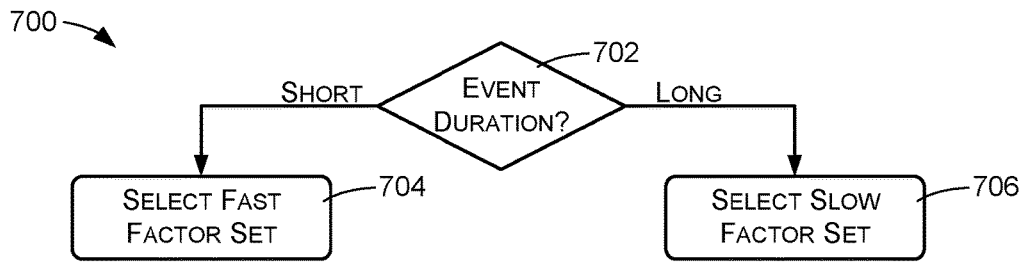
FIG. 7 is a flow diagram illustrating selection of attenuation factors based on the calculated width of the energy pulse.

FIG. 7 illustrates an example method of selecting a set of one or more attenuation factors k for use in the action 410 of FIG. 4. An action 702 comprises determining whether the transient sound duration indicated by the action 510 is relatively short or relatively long. For example, the action 702 may comprise comparing the energy pulse width as calculated in the action 510 to a duration threshold such as 16 ms. If the energy pulse width does not exceed the duration threshold, an action 704 is performed, in which a set of relatively large or "fast" attenuation factors is selected. If the energy pulse width exceeds the duration threshold, an action 706 is performed, in which a set of relatively small or "slow" attenuation factors is selected.

Each set of attenuation factors may include an "attack" factor, which is used to attenuate positive changes in the effective signal level. Each set of attenuation factors may also include a "release" factor, which is used to attenuate negative changes in the effective signal level. The factors of the first set, used in response to a short transient sound duration, comprise factors that are larger or "faster" than the respective factors of the second set, which are used in response to longer transient sound durations.

As an example, the attack attenuation factor of the first set may equate to a 3 ms attack time and the release attenuation factor of the first set may equate to a 30 ms release time. The attack attenuation factor of the second set may equate to a 10 ms attack time and the release attenuation factor of the second set may equate to a 100 ms release time.

The attack time may be defined as the time for the effective signal level S(n) to rise from 10% to 90% of its final value in response to a step input. The release time may be defined as the time for the effective signal level S(n) to fall from 90% to 10% of its final value in response to a step input. In the described embodiments, each attenuation factor k may be calculated in accordance with the following equation:

$$k = 1 - \exp\left(\frac{-2.2}{fs \cdot t}\right)$$

where fs is a sampling rate in Hertz and t is the desired attack or release time in seconds.

Figure 8:
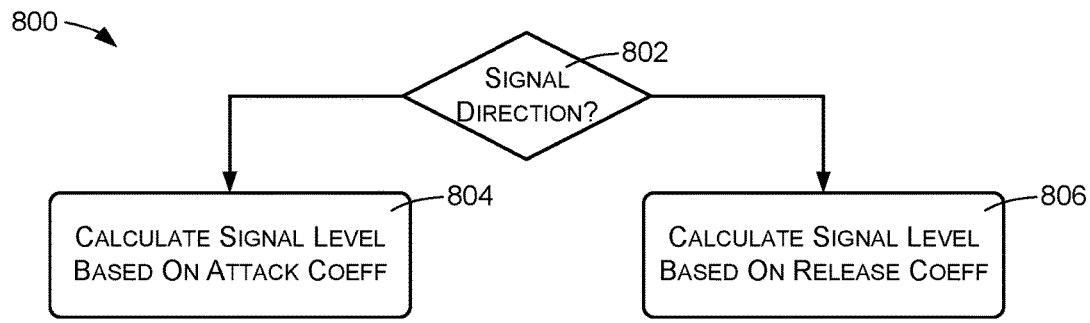
FIG. 8 is a flow diagram illustrating selection of attenuation factors based on whether an input signal is increasing or decreasing in magnitude.

FIG. 8 illustrates more specifically how the attenuation may be implemented, based on a set of attenuation factors that has been selected by the method 700 of FIG. 7. An action 802 comprises determining a direction of change of the energy signal E. Specifically, the action 802 may comprise evaluating the following conditional:

$$E(n)>E(n-1)$$

If E(n) is greater than E(n−1), the energy signal is increasing and an action 804 is performed of calculating the effective signal level S(n) based on the attack attenuation factor of the selected set of attenuation factors. More specifically, the action 804 may comprise calculating the effective signal level S(n) in accordance with the following:

$$S(n)=S(n-1)+k_1*(E(n)-S(n-1));$$

where $k_1$ is the attack attenuation factor of the selected set of attenuation factors.

If E(n) is not greater than E (n−1), the energy signal E is decreasing and an action 806 is performed of calculating the effective signal level S(n) based on the selected release damping factor. More specifically, the action 806 may comprise calculating the effective signal level S(n) in accordance with the following:

$$S(n)=S(n-1)+k_2*(E(n)-S(n-1));$$

where $k_2$ is the release attenuation factor of the selected set of attenuation factors.

Figure 9:
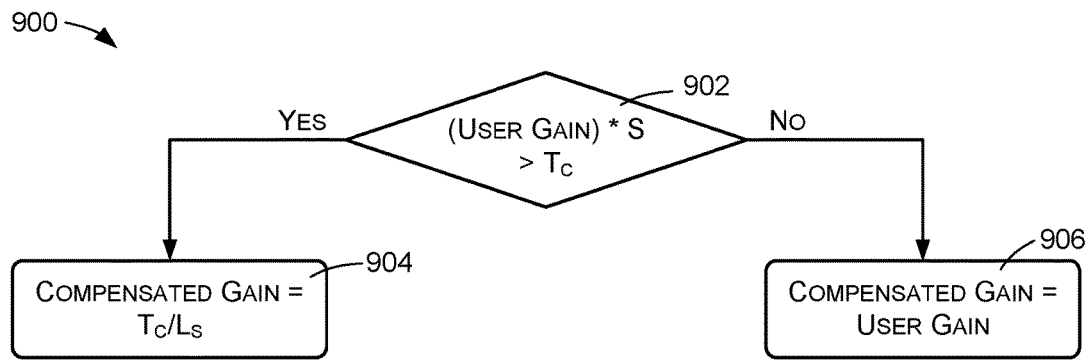
FIG. 9 is a flow diagram illustrating an example method of calculating a compensated output gain.

FIG. 9 shows an example method 900 of calculating the preliminary gain $g_1(n)$. An action 902 comprises determining whether a function of the user gain G and the effective signal level S(n) is greater than a compression threshold. More specifically, the action 902 may comprise determining whether the product of the user gain G and the effective signal level S(n) is greater than a compression threshold $T_C$. If the product of the user gain G and the effective signal level S(n) is greater than the compression threshold $T_C$, an action 904 is performed of calculating the compensated gain as $T_C/S(n)$. Otherwise, if the product of the user gain and the effective signal level S(n) is not greater than the compression threshold $T_C$, an action 906 is performed of setting the preliminary gain $g_1(n)$ equal to the user gain G.

Although techniques have been described with respect to a single audio signal, similar techniques may be used for multiple channel audio signals, such as stereo signals and surround-sound signals, in which audio content contains multiple input signals. In these cases, each input signal is analyzed independently in accordance with the techniques described above to calculate a respective effective signal level. The effective signal levels are then summed and/or averaged to create a composite effective signal level. The composite signal level is used to calculate an output gain in accordance with FIG. 9, and the resulting output gain is applied to each of the input signals to create respective amplified output signals.

Figure 10:
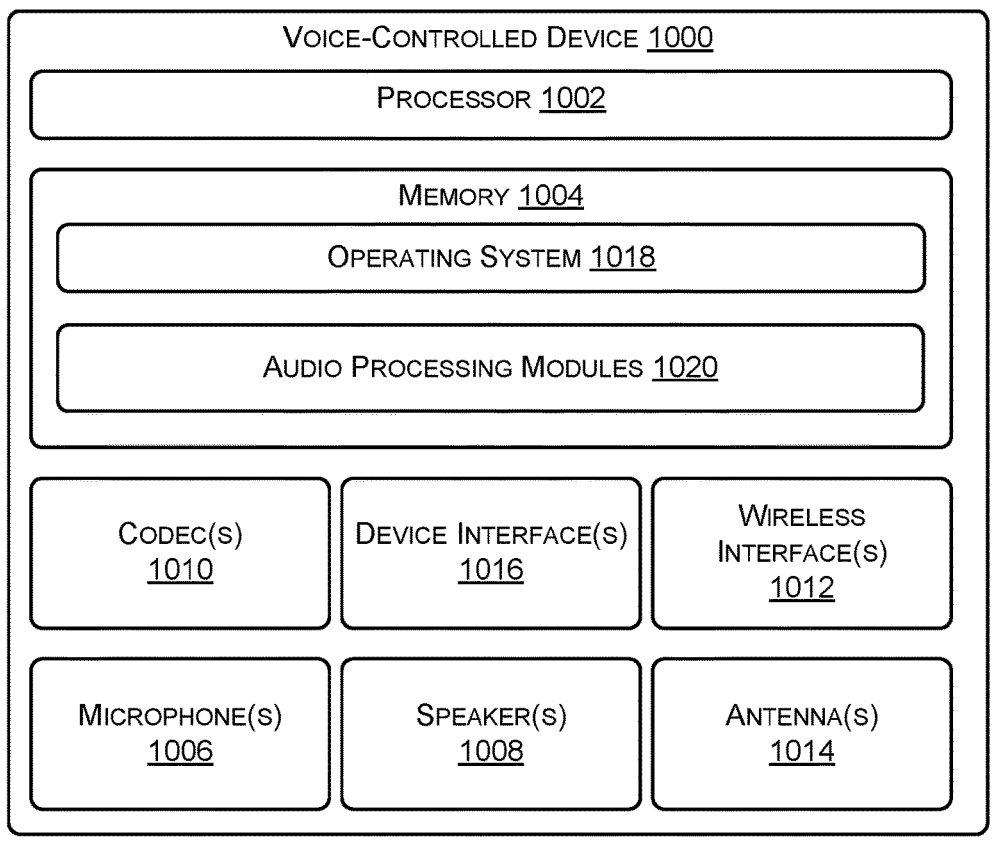
FIG. 10 is a block diagram of a system that may be used to apply adaptive gain control in accordance with the techniques described herein.

FIG. 10 shows an example of an audio system, element, or component that may be configured to perform loudness control in accordance with the techniques described above. In this example, the audio system comprises a voice-controlled device 1000 that may function as an interface to an automated system. However, the devices and techniques described above may be implemented in a variety of different architectures and contexts. For example, the described adaptive loudness control may be used in various types of devices that perform audio processing, including mobile phones, entertainment systems, communications components, and so forth.

The voice-controlled device 1000 may in some embodiments comprise a module that is positioned within a room, such as on a table within the room, which is configured to receive voice input from a user and to initiate appropriate actions in response to the voice input. In the illustrated implementation, the voice-controlled device 1000 includes a processor 1002 and memory 1004. The memory 1004 may include computer-readable storage media ("CRSM"), which may be any available non-transitory physical media accessible by the processor 1002 to execute instructions stored on the memory 1004. In one basic implementation, CRSM may include random access memory ("RAM") and flash memory. In other implementations, CRSM may include, but is not limited to, read-only memory ("ROM"), electrically erasable programmable read-only memory ("EEPROM"), or any other medium which can be used to store the desired information and which can be accessed by the processor 1002.

The voice-controlled device 1000 includes a microphone unit that comprises one or more microphones 1006 to receive audio input, such as user voice input. The device 1000 also includes a loudspeaker unit that includes one or more loudspeakers 1008 to output audio sounds. One or more codecs 1010 are coupled to the microphone(s) 1006 and the loudspeaker(s) 1008 to encode and/or decode audio signals. The codec(s) 1010 may convert audio data between analog and digital formats. A user may interact with the device 1000 by speaking to it, and the microphone(s) 1006 captures sound and generates an audio signal that includes the user speech. The codec(s) 1010 encodes the user speech and transfers that audio data to other components. The device 1000 can communicate back to the user by emitting audible sounds or speech through the loudspeaker(s) 1008. In this manner, the user may interact with the voice-controlled device 1000 simply through speech, without use of a keyboard or display common to other types of devices.

In the illustrated example, the voice-controlled device 1000 includes one or more wireless interfaces 1012 coupled to one or more antennas 1014 to facilitate a wireless connection to a network. The wireless interface(s) 1012 may implement one or more of various wireless technologies, such as wifi, Bluetooth, RF, and so forth.

One or more device interfaces 1016 (e.g., USB, broadband connection, etc.) may further be provided as part of the device 1000 to facilitate a wired connection to a network, or a plug-in network device that communicates with other wireless networks.

The voice-controlled device 1000 may be designed to support audio interactions with the user, in the form of receiving voice commands (e.g., words, phrase, sentences, etc.) from the user and outputting audible feedback to the user. In one implementation, the voice-controlled device 1000 may include control mechanisms such as basic volume control button(s) for increasing/decreasing volume, as well as power and reset buttons.

Several modules such as instruction, datastores, and so forth may be stored within the memory 1004 and configured to execute on the processor 1002. An operating system module 1018, for example, may be configured to manage hardware and services (e.g., wireless unit, Codec, etc.) within and coupled to the device 1000 for the benefit of other modules. In addition, the memory 1004 may include one or more audio processing modules 1020, which may be executed by the processor 1002 to perform the methods described herein, as well as other audio processing functions. In some cases, the processor 1002 may include one or more digital signal processors for use by the audio processing modules 1020, and the digital signal processors may be configured by way of programs and instructions to perform the methods and techniques described herein.

Although the example of FIG. 10 shows a programmatic implementation, the functionality described above may be performed by other means, including non-programmable elements such as analog components, discrete logic elements, and so forth. Thus, in some embodiments various ones of the components, functions, and elements described herein may be implemented using programmable elements such as digital signal processors, analog processors, and so forth. In other embodiments, one or more of the components, functions, or elements may be implemented using specialized or dedicated circuits. The term "component", as used herein, is intended to include any hardware, software, logic, or combinations of the foregoing that are used to implement the functionality attributed to the component.

Although the discussion above sets forth example implementations of the described techniques, other architectures may be used to implement the described functionality, and are intended to be within the scope of this disclosure.

Furthermore, although specific distributions of responsibilities are defined above for purposes of discussion, the various functions and responsibilities might be distributed and divided in different ways, depending on circumstances.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
  receiving a gain setting that is based at least in part on user input;
  receiving an input audio signal comprising an ordered sequence of input values, the ordered sequence comprising a first input value;
  analyzing a first set of the input values to determine a first dynamic range of the input audio signal;
  determining that the first dynamic range exceeds a dynamic range threshold;
  analyzing a second set of the input values to determine a duration of a first energy pulse of the input audio signal, wherein the second set comprises input values that follow the first input value in the ordered sequence;
  determining that the duration of the first energy pulse exceeds a duration threshold;
  selecting a first set of multiple attenuation factor sets, wherein each attenuation factor set comprises one or more attenuation factors, each attenuation factor of the first set of multiple attenuation factor sets being smaller than a corresponding attenuation factor of a second set of the multiple attenuation factor sets;
  averaging absolute values of the input values of the first set of input values to determine a first energy of the input audio signal;
  calculating a first signal level corresponding to the first set of input values in accordance with the following equation:

$$S(n)=S(n-1)+k*(E(n)-S(n-1));$$

wherein S(n) is the first signal level, S(n−1) is a previously calculated signal level corresponding to preceding set of input values that precedes the first set of input values in the ordered sequence of input values, k is an attenuation factor of the first set of the multiple attenuation factor sets, and E(n) is the first energy;
  determining that a product of the first signal level and the gain setting exceeds a compression threshold;
  calculating a first output gain as a ratio of the compression threshold to the first signal level; and
  multiplying the first input value by the first output gain to create a first output value of an output audio signal.

2. The method of claim 1, the ordered sequence of input values comprising a second input value, the method further comprising:
  analyzing a third set of the input values to determine a duration of a second energy pulse of the input audio signal, wherein the third set comprises input values that follow the second input value in the ordered sequence;
  determining that the duration of the second energy pulse does not exceed the duration threshold;
  selecting the second set of the multiple attenuation factor sets;
  calculating a second signal level using an attenuation factor of the second set of the multiple attenuation factor sets;
  determining that a product of the second signal level and the gain setting exceeds the compression threshold;
  calculating a second output gain as a ratio of the compression threshold to the second signal level; and
  multiplying the second input value by the second output gain to create a second output value of the output audio signal.

3. The method of claim 1, the ordered sequence of input values comprising a second input value, the method further comprising:
  analyzing a third set of the input values to determine a second dynamic range of the input audio signal;
  determining that the second dynamic range does not exceed the dynamic range threshold; and
  setting a second signal level equal to the first signal level.

4. The method of claim 1, wherein analyzing the second set of the input values comprises:
  calculating an ordered sequence of energy values, the energy values corresponding respectively to the input values of the ordered sequence of input values;
  identifying a maximum energy value of the ordered sequence of energy values;
  identifying a preceding energy value that is (a) less than the maximum energy value by at least a threshold amount and (b) before the maximum energy value in the ordered sequence of energy values; and
  identifying a following energy value that is (a) less than the maximum energy value by at least the threshold amount and (b) after the maximum energy value in the ordered sequence of energy values.

5. A device, comprising:
  one or more processors;
  computer-readable media storing instructions that are executable by the one or more processors to perform actions comprising:
    receiving a gain setting that is based at least in part on user input;
    receiving an input audio signal comprising an ordered sequence of input values;
    analyzing a first set of the input values to determine a duration of a first energy pulse of the input audio signal;
    calculating a sequence of signal energies, each signal energy being of a respective second set of the input values;
    smoothing the sequence of signal energies by a degree that depends at least in part on the duration of the first energy pulse to produce a sequence of signal levels;
    determining that a function of the gain setting and a first of the signal values exceeds a compression threshold;
    calculating a first output gain based at least in part on the first signal value; and
    multiplying a first input value of the ordered sequence of input values by the first output gain to create a first output value of an output signal.

6. The device of claim 5, the actions further comprising:
  analyzing a third set of the input values to determine a dynamic range of the input audio signal;
  determining that the dynamic range does not exceed a dynamic range threshold;
  setting a second of the signal levels to the first signal level;

determining that a function of the second signal level and the gain setting exceeds the compression threshold;

calculating a second output gain based at least in part on the second signal level; and multiplying the second input value by the second output gain to create a second output value of the output signal.

7. The device of claim 6, wherein determining the dynamic range of the input audio signal comprises:

determining an amplitude boundary within an energy signal corresponding to the input audio signal is contained;

determining an average amplitude of the energy signal; and calculating a ratio of the amplitude boundary and the average value.

8. The device of claim 5, wherein determining the duration of the first energy pulse comprises:

identifying a second input value that corresponds to a maximum energy of the input audio signal;

identifying a preceding input value that (a) corresponds to an energy of the input audio signal that is less than the maximum energy by at least a threshold amount and (b) is before the second input value in the ordered sequence of input values; and identifying a following energy value that (a) corresponds to an energy of the input audio signal that is less than the maximum energy by at least the threshold amount and (b) is after the second input value in the ordered sequence of input values.

9. The device of claim 5, wherein calculating the signal of a respective second set of the input values comprises averaging the input values of the second set.

10. The device of claim 5, wherein the smoothing comprises:

attenuating a positive change in a first signal energy relative to a signal energy that is previous to the first signal energy in the sequence of signal energies using a first attenuation parameter; and attenuating a negative change in a second signal energy relative to a signal energy that is previous to the second signal energy in the sequence of signal energies using a second attenuation parameter, wherein the second attenuation parameter produces less attenuation than the first attenuation parameter.

11. The device of claim 5, the actions further comprising comparing the duration of the first energy pulse to a threshold to select the degree of the smoothing.

12. The device of claim 5, wherein smoothing the sequence of signal energies comprises:

determining that the duration of the first energy pulse is greater than a threshold;

attenuating a change in a first signal energy relative to a signal energy that is previous to the first signal energy in the sequence of signal energies using a first attenuation parameter;

analyzing a third set of the input values to determine a duration of a second energy pulse of the input audio signal;

determining that the duration of the second energy pulse is less than the threshold;

attenuating a change in a second signal energy relative to a signal energy that is previous to the second signal energy in the sequence of signal energies using a second attenuation parameter;

wherein the second attenuation factor produces less smoothing than the first attenuation factor.

13. The device of claim 5, wherein the smoothing comprises calculating the first signal level in accordance with the following equation:

$$S(n)=S(n-1)+k*(E(n)-S(n-1));$$

wherein $S(n)$ is the first signal level, $S(n-1)$ is a previously calculated signal level corresponding to a preceding set of the input values that precedes the second set of input values in the ordered sequence of input values, k is an attenuation factor, and $E(n)$ is an energy of the second set of input values.

14. A method, comprising:
receiving an input audio signal;
amplifying the input audio signal by an output gain;
varying the output gain based at least in part on a changing magnitude of the input audio signal;
determining a duration of an energy pulse of the input audio signal; and
smoothing the output gain by a degree that depends at least in part on the duration of the energy pulse.

15. The method of claim 14, wherein determining the duration of the energy pulse comprises:

calculating an ordered sequence of energy values;
identifying a maximum energy value of the ordered sequence of energy values;
identifying a preceding energy value that is (a) less than the maximum energy value by at least a threshold amount and (b) before the maximum energy value in the ordered sequence of energy values; and
identifying a following energy value that is (a) less than the maximum energy value by at least the threshold amount and (b) after the maximum energy value in the ordered sequence of energy values.

16. The method of claim 14, wherein the smoothing comprises:

attenuating upward changes in the output gain by a first degree;
attenuating downward changes in the output gain by a second degree that is less than the first degree.

17. The method of claim 14, wherein the smoothing comprises:

attenuating a magnitude of the input audio signal to determine a signal level; and
calculating the output gain based at least in part on the signal level.

18. The method of claim 17, further comprising determining the magnitude of the input audio signal, wherein determining the magnitude comprises averaging multiple input values of the input audio signal.

19. The method of claim 17, wherein the smoothing comprises calculating the signal level in accordance with the following equation:

$$S(n)=S(n-1)+k*(E(n)-S(n-1));$$

wherein $S(n)$ is the signal level, $S(n-1)$ is a previously calculated signal level, k is an attenuation factor, and $E(n)$ is an energy of the input audio signal.

20. The method of claim 17, the actions further comprising receiving a gain setting that is based at least in part on user input, further comprising calculating the output gain based at least in part on the gain setting.

* * * * *